United States Patent
Chang

(10) Patent No.: US 6,673,682 B2
(45) Date of Patent: Jan. 6, 2004

(54) METHODS OF FABRICATING HIGH DENSITY MASK ROM CELLS

(75) Inventor: Ching-Yu Chang, Hsinchu (TW)

(73) Assignee: Macronix International Co. Ltd., Hsinchu (TW)

(*) Notice: Subject to any disclaimer, the term of this patent is extended or adjusted under 35 U.S.C. 154(b) by 0 days.

(21) Appl. No.: 10/144,874

(22) Filed: May 13, 2002

(65) Prior Publication Data

US 2003/0211695 A1 Nov. 13, 2003

(51) Int. Cl.[7] .......................................... H01L 21/8236
(52) U.S. Cl. ....................................... 438/276; 438/278
(58) Field of Search ................................ 438/275, 276, 438/277, 278, 282, 290, 291

(56) References Cited

U.S. PATENT DOCUMENTS

| 5,536,669 A | * | 7/1996 | Su et al. ........................ 438/276 |
| 5,627,091 A | * | 5/1997 | Hong ........................... 438/276 |
| 5,920,100 A | * | 7/1999 | Wen ............................ 257/390 |
| 6,274,453 B1 | * | 8/2001 | Schlösser et al. ............ 438/386 |
| 6,300,200 B1 | * | 10/2001 | Chang ......................... 438/275 |
| 6,551,899 B1 | * | 4/2003 | Yu et al. ...................... 438/412 |
| 2003/0134478 A1 | * | 7/2003 | Lai et al. ...................... 438/275 |

* cited by examiner

*Primary Examiner*—T. N. Quach
(74) *Attorney, Agent, or Firm*—Stout, Uxa, Buyon & Mullins, LLP

(57) ABSTRACT

Methods for making integrated circuit devices, such as high density memory devices and memory devices exhibiting dual bits per cell, include forming multiple oxide fences on a semiconductor substrate between multiple polybars. The oxide fences create a hole pre-code pattern that facilitates ion implantation into trenches disposed between the polybars. The holes, or voids, formed by the oxide fences provide greater control of the critical dimension of ion implantation, for example, the critical dimension of the trench sidewalls. Semiconductor devices used in the manufacture of memory devices include the oxide fences during the manufacturing process.

22 Claims, 4 Drawing Sheets

METHODS OF FABRICATING HIGH DENSITY MASK ROM CELLS

BACKGROUND OF THE INVENTION

1. Field of the Invention

This application relates to methods of fabricating integrated circuit devices and, more particularly, to methods of fabricating high density memory cells in integrated circuit devices.

2. Description of Related Art

Successful manufacture of high density memory devices, such as read only memory (ROM) devices, including EPROM, and EEPROM memory devices, is determined by the resolution capabilities of the processes used in the manufacture of such devices. For example, optical photolithographic processes have been developed to utilize smaller wavelengths of light to pattern the components of the semiconductor memory devices. The smaller wavelengths of light provide finer precision in exposing regions of the memory devices to the light. Currently, lasers are being employed in the processing of these memory devices.

However, as the demand for higher density memory devices increases, physical limits of the manufacturing processes are being approached. For example, in certain memory devices, the code implantation area may be about 0.15 um$^2$ in a 0.15 um process. The resolution limit of optical lithography can be very near 0.15 um. Thus, refraction of light may substantially affect the manufacture of memory devices, and corrective measures, such as optical proximity correction, are frequently employed to address and reduce potential manufacturing defects. These corrective processes can require a substantial amount of time and cost to implement, and thus, such corrective measures although not desirable may nonetheless be necessary in conventional methods.

In addition, as the density of the memory device elements increases, it is critical to isolate structures that will carry electrical current. The isolation structure dimensions also must be reduced to meet the density demands of the devices. One approach to isolating memory gates is to form trenches in the semiconductor substrate between the gates or the memory cells. The isolation trenches may be implanted with ions to create source and drain regions of the cells.

In order to increase the density of information that a ROM device can store, a relatively new memory architecture comprising dual bit cells is gaining acceptability. Standard ROM cell transistors are programmed (i.e., implanted) in the channel region beneath the gate to have a bit value of 1 or 0, corresponding to two states in which the cell can exist. In a two bit cell configuration, each ROM cell transistor can be programmed (i.e., implanted) on either side of the gate, with each implant corresponding to a bit. In contrast to the standard cell transistor which can be programmed to either of two states (i.e., 1 or 0), the dual bit protocol allows the cell transitor to be programmed to any of four states (i.e., 00, 01, 10, or 11). Thus, the storage capacity of each cell transistor can be increased without increasing the number of transistors on the chip.

However, as discussed above, because the densities of the components of the memory devices are approaching the physical limits of the processes used in the manufacture of the memory devices, the ion implantation process can become more difficult and time consuming. Additionally, in a dual bit process the number of implant steps may increase. Conventional methods address this problem by making smaller and smaller implantation windows to promote greater precision in the ion implantation. However, as the ion implantation window size decreases, ions are implanted over a smaller area, which can result in little, if any, implantation of the sidewalls of the isolation trenches which is necessary in the creation of certain dual bit cell architectures.

To continue to meet the demand of increasing the density of transistors and other elements of memory devices, new methods will be needed to overcome the limitations of current methods. Thus, there remains a need for methods of fabricating memory cells in integrated circuit devices which reduce or eliminate the problems associated with conventional methods, including, for example, problems associated with the physical limits of photolithographic processes.

SUMMARY OF THE INVENTION

The present invention addresses these needs by providing methods of fabricating memory devices that can improve the ion implantations of the isolation trenches in the memory devices. The invention herein disclosed provides greater control of critical dimension compared to conventional methods. The invention also provides a larger process window for ion implantation, and provides control of the trench sidewall critical dimension.

The invention disclosed herein provides methods of effectively controlling the critical dimension of the trench sidewalls to permit more effective ion implantation into the trench sidewalls, by forming a pre-code hole pattern in a semiconductor device. The pre-code hole pattern provides more effective removal of photoresist that may be present within the holes as compared to conventional methods, and creates an aperture for ion implantation into the trench sidewall that can avoid the shortcomings of conventional optical lithographic methods.

In accordance with the present invention, a method for making an integrated circuit on a semiconductor substrate may comprise the steps of (a) providing a semiconductor substrate that has a plurality of polybars disposed on the substrate and oriented parallel to each of the other polybars and disposed on either side of a trench formed in the semiconductor substrate thereby creating a channel between the polybars; (b) forming a plurality of reflective dielectric fences, formed by materials such as SOG or an oxide, between the plurality of polybars and in the trench to create a plurality of voids bounded by the plurality of polybars and the reflective dielectric fences; (c) implanting a dopant into the voids; (d) removing the reflective dielectric fences, and (e) implanting a dopant into a base of the trench. The reflective dielectric fences may be formed by removing portions of a dielectric layer (e.g. oxide) formed in the trench and channel between the polybars.

The foregoing method may also comprise the steps of adding one or more thin oxide layers to the existing structures, and adding a thin polysilicon over the thin oxide. A step of filling the voids with photoresist before implanting the dopant into the voids may be provided. A step of removing photoresist from select voids using a first photoresist mask having a pattern for a first ROM code may also be provided. A further step of the foregoing method may also include filling in the select voids with a second photoresist and removing photoresist from select voids using a second photoresist mask having a pattern for a second ROM code.

A method in accordance with the present invention may also comprise the steps of (a) providing a semiconductor substrate having a plurality of polybars disposed on the substrate, where each of the polybars are oriented parallel to the other polybars and are disposed on either side of a trench formed in the semiconductor substrate thereby creating a channel between the polybars; (b) forming a reflective dielectric fence (e.g. oxide or SOG) between the plurality of polybars to create a plurality of voids bounded by the plurality of polybars and the reflective dielectric fence; (c) filling the voids with photoresist and removing the photoresist from select voids using a first photoresist mask having a pattern for a first ROM code; (d) implanting a dopant into the voids having the photoresist removed in step (c); (e) filling the voids implanted in step (d) with photoresist and removing the photoresist from select voids using a second photoresist mask having a pattern for a second ROM code; and (f) implanting a dopant into the voids having the photoresist removed in step (e).

The above method may also further comprise the steps of adding one or more thin oxide layers and a thin polysilicon layer over the thin oxide layers. The channel between the polybars has a length and the reflective dielectric fence may be orthogonally disposed to the length of the channel. The photoresist used in the foregoing methods may be used without first applying an anti-reflective coating. The dopant used in the foregoing methods may be an N-type impurity, such as arsenic or phosphorous. The dopant of the foregoing methods may be implanted into one or more sidewalls of the trench. For example, the dopant may be implanted at an angle 15° from normal, or from a vertical line extending through the semiconductor substrate. The voids formed in the foregoing methods may enhance control of the critical dimension of the sidewall.

A method for making an integrated circuit on a semiconductor substrate may also comprise the steps of (a) forming a plurality of polybars on the semiconductor substrate, each polybar having a length and comprising a gate oxide layer, a polybar conductive layer, and a polybar dielectric layer, and each polybar being parallelly disposed to each of the other polybars on the semiconductor substrate; (b) forming a trench in the semiconductor substrate between the plurality of polybars, thereby creating a channel between the polybars; (c) filling the trench and the channel with a reflective dielectric layer (e.g. oxide or SOG); (d) removing portions of the reflective dielectric layer in the trench to form a pattern perpendicular to the length of the polybars, and to form a plurality of voids on the semiconductor substrate wherein each void is bounded by the polybars and portions of the reflective dielectric layer not removed; (e) filling the voids with a first photoresist; (f) selectively removing the first photoresist from certain voids; (g) implanting a dopant into the voids without photoresist; (h) filling the voids without the first photoresist with a second photoresist; (i) selectively removing the second photoresist from certain voids; (j) implanting the dopant into the voids without photoresist; (k) removing the remaining photoresist from the semiconductor substrate; (l) removing the reflective dielectric layer from the trench; and (m) implanting a dopant into a base of the trench.

In accordance with the present invention, the foregoing methods provide a semiconductor device having a semiconductor substrate which is used in the manufacture of an integrated circuit; which can comprise a plurality of polybars disposed on a dielectric layer disposed over the semiconductor substrate, which polybars are oriented parallel to each other and disposed on both sides of a trench in the semiconductor substrate; wherein during a processing step a reflective dielectric fence (e.g. oxide or SOG) is orthogonally disposed on the semiconductor substrate between the plurality of polybars to create a plurality of voids bounded by the polybars and the reflective dielectric fence. The semiconductor device may also comprise a dopant implanted into a sidewall of the trench. In addition, the device may comprise a plurality of word lines orthogonally disposed over the polybars and bit lines disposed in parallel fashion relative to the polybars, after the removal of the oxide fences.

Thus, the present invention departs from conventional methods by creating a pre-code hole pattern in a semiconductor device, the pre-code hole pattern being defined by two reflective dielectric (e.g. oxide or SOG) fences, the trench walls and base, and the channel walls. The pre-code hole pattern provides effective ion implantation into the device without being constrained by certain physical limits of optical photolithographic processes. The pre-code hole pattern also improves the removal of photoresist from areas to be implanted with ions due to reflectivity provided within the holes.

Any feature or combination of features described herein are included within the scope of the present invention provided that the features included in any such combination are not mutually inconsistent as will be apparent from the context, this specification, and the knowledge of one of ordinary skill in the art.

Additional advantages and aspects of the present invention are apparent in the following detailed description and claims.

DETAILED DESCRIPTION OF THE PRESENTLY PREFERRED EMBODIMENTS

Figure 1:
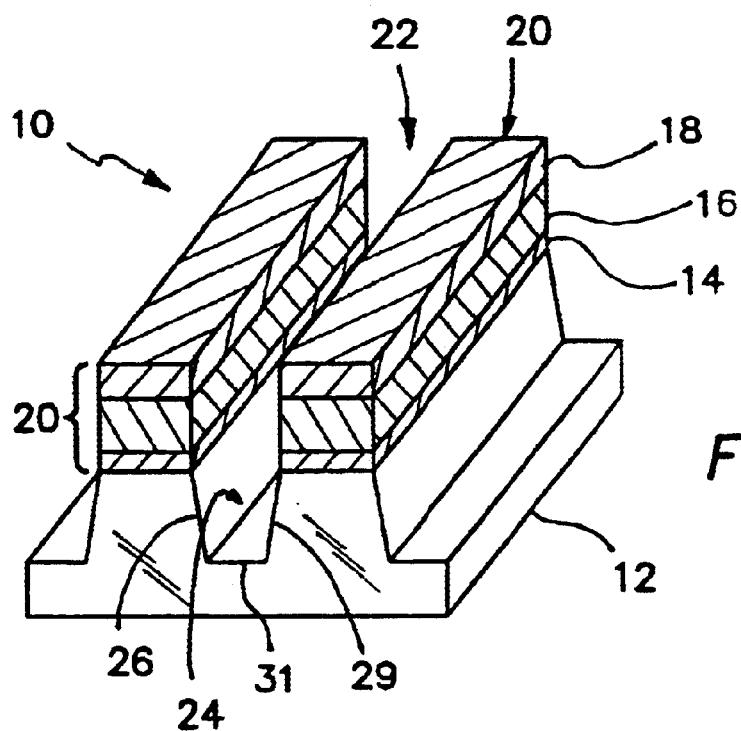
FIG. 1 is a perspective view of a semiconductor device used in the fabrication of a memory device.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims. For example, it is understood by a person of ordinary skill practicing this invention that the pre-hole code pattern formed in the methods of the present invention may be formed in NMOS, PMOS, CMOS and bipolar devices, to provide effective ion implantation in high density memory cells, such as memory cells with critical dimensions that are similar to physical limits of optical photolithography processes.

It is to be understood and appreciated that the process steps and structures described herein do not cover a complete process flow for the manufacture of memory devices. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 illustrates a perspective view of a semiconductor device 10 in an intermediate processing step according to the present invention. The semiconductor device 10 comprises a semiconductor substrate 12 which may be a P-type silicon substrate, a gate oxide layer 14 grown over the substrate, a conductive or semi-conductive layer 16 deposited over the oxide layer, such as a polysilicon layer, and a dielectric layer 18, such as a silicon nitride ($Si_3N_4$) layer grown on the polysilicon.

The gate oxide layer 14, the polysilicon layer 16, and the silicon nitride layer 18 have been formed on semiconductor substrate 12 and etched using conventional methods to form a plurality of polybars 20. For example, the gate oxide layer 14 may be grown on the semiconductor substrate 12, and the polysilicon layer 16 may be formed by chemical vapor deposition (CVD) methods, including low pressure chemical vapor deposition. The silicon nitride layer 18 may then be formed over polysilicon layer 16 using similar methods; for example, silicon nitride layer 18 may be grown or deposited on polysilicon layer 16. The gate oxide layer 14 may have a thickness between 20 and 250 Angstroms, the polysilicon layer 16 may be between 500 and 2000 Angstroms, and the silicon nitride layer 18 may be between 400 and 2000 Angstroms. Accordingly, one surface (e.g., the upper surface) of semiconductor substrate 12 may be completely covered by gate oxide layer 14, polysilicon layer 16 and silicon nitride layer 18. As understood in the art, semiconductor substrate 12 may also be an N-type silicon substrate, and dielectric layer 18 may also comprise silicon dioxide ($SiO_2$), borophosphosilicate glass, phosphosilicate glass, borosilicate glass, or a composite layer or ONO layer (which may be fabricated from layers of silicon oxide, silicon nitride, and silicon dioxide).

Prior to the application of the dielectric silicon nitride layer 18, a series of implants are preferably performed through the gate oxide layer 14 and polysilicon layer 16 to alter the electrical properties of the wafer near its surface. In the presently preferred embodiment, two boron implants are performed, the first having an energy between 50 and 100 K, and the second having an energy between 100 and about 150 K. A photoresist layer may be applied and patterned prior to implanting the wafer to control the areas on the wafer that are to be implanted.

Regarding the etching of the gate oxide layer 14, the polysilicon layer 16, and the silicon nitride layer 18 to form the polybars 20, after formation of the gate oxide layer 14, the polysilicon layer 16, and the silicon nitride layer 18 a plurality of photoresist bars (not shown) are positioned over the silicon nitride layer 18. As presently embodied, the photoresist bars originate with one or more photoresist layers being placed over silicon nitride layer 18 in accordance with well known photolithography principles understood in the art. The photoresist layer is patterned to form elongate openings in the photoresist layer, to thereby define the photoresist bars. The photoresist bars, which are separated one from another by the elongate openings, operate to prevent removal of the material disposed thereunder during the sequent etching process.

The multilayer stack formed on the wafer is then etched using conventional methods, such as dry etching or wet etching, to thereby create a channel 22 in the gate oxide layer 14, the polysilicon layer 16, and the silicon nitride layer 18, thus defining the polybars 20. Where the multilayer stack is exposed the silicon nitride layer 18 and the polysilicon layer 16 are completely removed, and the gate oxide layer 14 is etched such that a thickness between 5 and 20 A remains.

The photoresist bars can also be used as a hard mask for the etching of a trench 24 into the semiconductor substrate 12. As shown in FIG. 1, the trench 24 of the illustrated embodiment comprises a first trench sidewall 26, a second trench sidewall 29 and a trench base 31 extending between the first trench sidewall 26 and the second trench sidewall 29. In the illustrated embodiment, the first and second trench sidewalls 26 and 29 are tapered relative to the trench base 31, and the trench base 31 comprises a generally planar surface extending substantially entirely between the first and second trench sidewalls 26 and 29. The first and second trench sidewalls 26 and 29 may form angles from, for example, about 60 degrees to about 90 degrees with the trench base 31. In a presently preferred embodiment, the first and second trench sidewalls 26 and 29 form 90 degree angles with the trench base 31. Subsequent to formation of the channel 22 and the trench 24, the photoresist bars may be removed from the polybars 14 by conventional methods known in the art, such as stripping. The photoresist may also be removed before etching trenches in the silicon, in which case the silicon nitride layer 18 serves as an etch barrier. The resultant trench is substantially the same as the aforementioned trench 24, having a first trench sidewall 26, a second trench sidewall 29, and a trench base 31.

Accordingly, the etching of the various layers 18, 16 and 14 disposed on the semiconductor substrate 12 is accomplished to form polybars 20 separated by channels 22 with trenches 24 formed at the bottoms of the channels 22. Each polybar 20 comprises a multilayered structure and further comprises a length and a width with the length being greater than the width. Thus, a semiconductor substrate having a plurality of parallel polybars disposed on the substrate on either side of a trench is provided to practice the methods of the present invention.

After the trenches 24 have been formed, at least one substantially uniform oxide layer between 20 and 100 A (not shown) is grown on the exposed silicon areas of the wafer, providing a thin oxide coating in the trenches 24 and channels 22. During the oxidation process, any silicon damage that may have occurred in previous implant and etch processing steps may be annealed. A thin layer of polysilicon (not shown) between 50 and 300 A is then deposited over the entire wafer.

Figure 2:
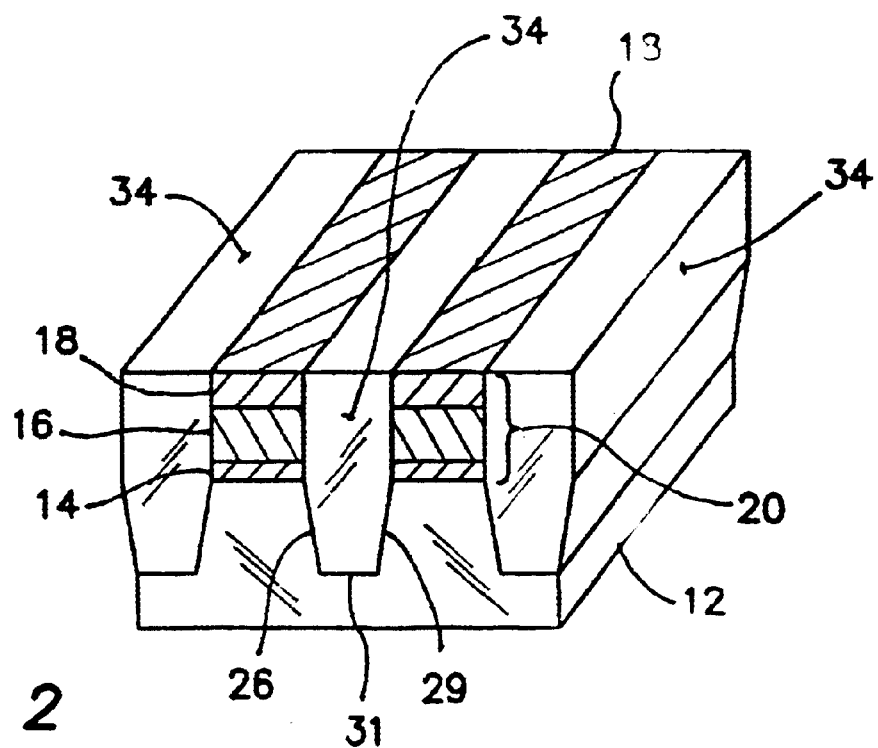
FIG. 2 is a perspective view of the device of FIG. 1 with an oxide layer disposed on the channels and trenches between the polybars.

FIG. 2 shows the device of FIG. 1 with the channels 22 and trenches 24 filled with an insulative material, such as an oxide 34. The oxide 34 may be deposited in the channels 22 and trenches 24 using conventional techniques known in the art, such as chemical vapor deposition. Alternatively, spin on glass (SOG) may be used to fill the channels.

The oxide can then be etched back by means such as a hydrofluoric (HF) acid wet etch or a dry etch. In the illustrated embodiment wherein the oxide layer disposed over the polysilicon layer 16 comprises a silicon nitride layer 18, the selectivity of the layers may be controlled during the etch by using a hydrofluoric acid wet etch or any other etching material having a substantially greater selectivity for the oxide 34 than the silicon nitride layer 18. In such a case, the thin polysilicon and oxide layers over the nitride layer are etched through, leaving the nitride layer as an etch stop. Thus, portions of the oxide layer 34 are etched at a rapid rate, compared to the etching rate of the silicon nitride layer 18. Alternatively, in embodiments wherein dry etching procedures are used to remove portions of the oxide layer 34, the silicon nitride layer 18 can provide a sufficient stop layer to thereby protect the underlying polysilicon layer 16. The oxide thickness may be etched back to approximately 1000 Angstroms in certain embodiments. In modified embodiments, the oxide layer is not etched back and the process flow may continue unabated to application of a photoresist layer as described below. In other modified embodiments, the polysilicon is used as an etch stop with an etchant having a high oxide to polysilicon selectivity.

Figure 3:
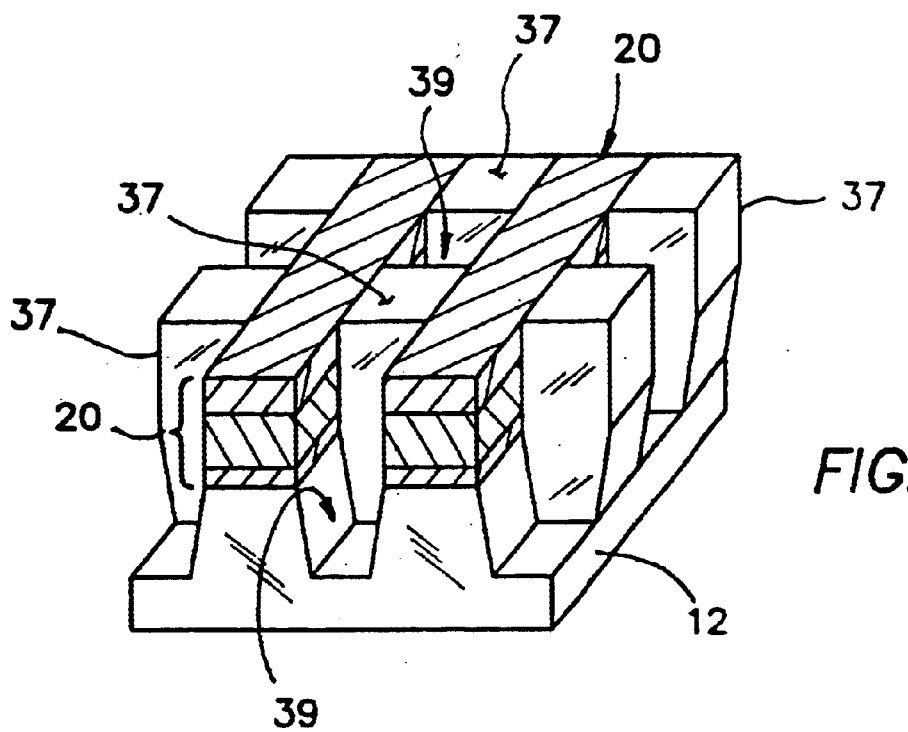
FIG. 3 is a perspective view similar to FIG. 2 with portions of the oxide layer removed to form a plurality of oxide fences.

A photoresist layer is then spun onto the oxide and patterned using standard photolithographic techniques to form a series of openings. The oxide 34 may then be etched to form a plurality of oxide fences 37, each fence corresponding to an area protected by the photoresist layer, as depicted in FIG. 3. The oxide 34 may be etched back using either wet etching techniques or dry etching techniques. For example, one or more photoresist layers can be placed over the silicon nitride layer 18 and the top surface of the oxide 34, and the photoresist layer or layers can then be patterned to form photoresist bars extending in a direction normal to the polybars 20. The photoresist bars can then be etched using conventional methods, such as dry etching or wet etching, to create the oxide fences 37. After etching, the photoresist bars may be removed using conventional methods such as a strip and ash procedure.

In reference to the disclosure herein, an oxide fence 37 refers to the oxide material in a channel 22 and trench 24 disposed between two polybars 20. In the illustrated embodiment of the present invention, oxide fences 37 are disposed in rows orthogonal to polybars 20. In other words, oxide fences 37 are lined up in a pattern parallel to that of a word line pattern that will be formed over the bit lines upon completion of the steps disclosed herein. Accordingly, two oxide fences 37 in a trench 24 (FIG. 1), and two polybars 20 will create a boundary defining a void 39. In other words, two oxide fences 37 disposed in a trench 24 and two polybars 20 disposed on both sides of the trench 24 create a generally square-shaped, pre-code hole pattern for implanting a dopant impurity, as described herein.

Figure 4:
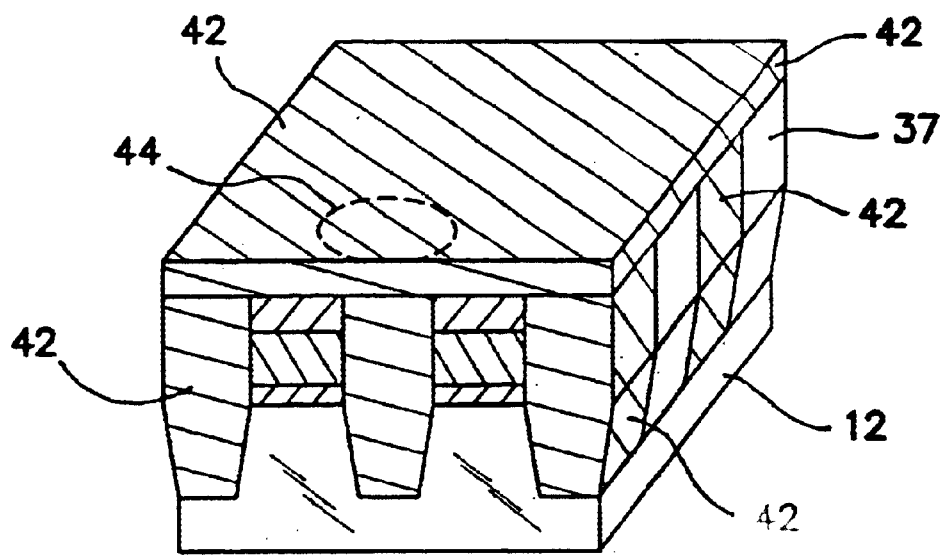
FIG. 4 is a perspective view similar to FIG. 3 with a photoresist layer deposited over the top of the polybars and oxide fences.

As illustrated in FIG. 4, a photoresist layer 42 is then deposited over the substrate to effectively fill voids 39. The photoresist 42 can then be removed from select voids 39 using a photoresist mask (not shown) comprising a first ROM code pattern. For example, a particular photoresist mask may embody a given first ROM code pattern, which specifies the removal of a single void 39 from the configuration of FIG. 4. As understood in the art, the number of voids to be cleared of photoresist 42 will vary depending on the particular first ROM code pattern employed. Thus, for purposes of illustration only, a single void 39 is selected for evacuation of photoresist therefrom in the figure. In the illustrated embodiment, the photoresist mask comprises an aperture which will facilitate the transmission of light through the photoresist mask and onto the photoresist layer 42 in a location and distribution as shown by the phantom boundary line 44. The photoresist mask may be configured with apertures having different shapes (e.g., circular as shown, or rectangular) and different sizes (e.g., slightly larger or smaller) to form different boundary distribution patterns 44.

Figure 5:
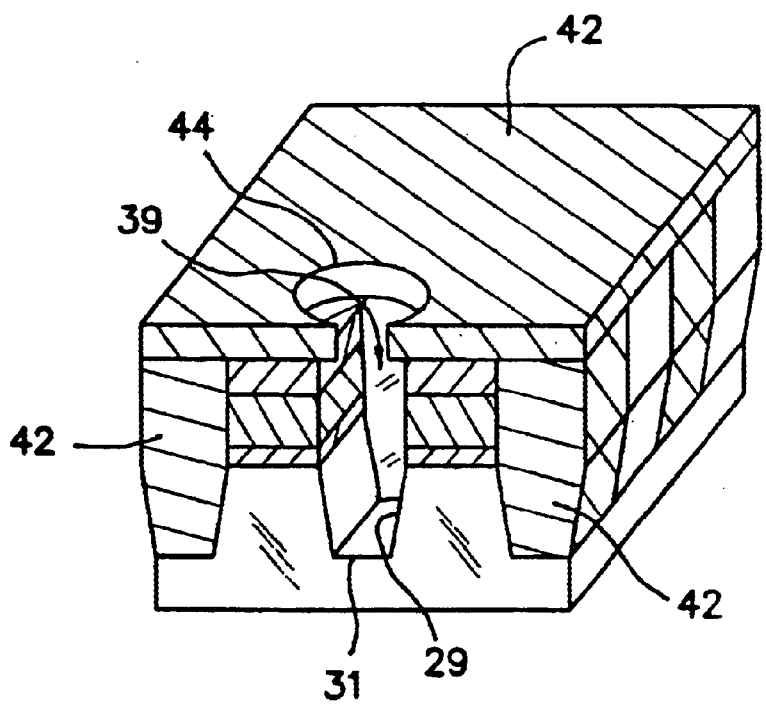
FIG. 5 is a perspective view similar to FIG. 4 with a portion of the photoresist layer removed to form a select void.

Turning now to FIG. 5, the photoresist 42 within the circular boundary line 44, and therebeneath within the single void 39, has been selectively removed. According to the present invention, reflection of light, such as ultraviolet light, within voids 39 provides effective dissociation and removal of the photoresist 42 from the voids. The oxide fences 37 provide a reflective surface, allowing greater illumination of the trenches 24 and channels 22. The photoresist 42 can be over-exposed and removed from the void, without influencing the next adjacent void or implant area. In accordance with a presently preferred embodiment, the photoresist 42 does not include an anti-reflective coating (ARC), such as a bottom ARC (BARC), to thereby enhance the reflection of light, such as ultraviolet light, within voids 39 and provide effective dissociation and removal of the photoresist 42 from the voids. The dissociation and removal of photoresist in accordance with the present invention can be achieved even when the reticule or mask critical dimension is smaller than the critical dimension of the void 39. Alternatively, the boundary line 44 may be off-center or misaligned with the rectangular opening of the via 39, in which case effective dissociation and removal of the photoresist 42 from the void 39 may still be possible due to internal reflections within the void.

In additional embodiments, the photoresist 42 may include one or more components that, when used in combination with the void surfaces, enhance the reflectivity of the light used to dissociate the photoresist. Regarding the void surfaces, in accordance with other embodiments, components for enhancing the reflectivity of the dissociating light can be incorporated into (or onto the exposed via 39 surface of) the oxide 42 and/or the silicon nitride 18 to the extent the properties (e.g., dielectric) of the oxide 42 and/or silicon nitride 18 remain adequate, or other suitable materials having greater reflectivity properties may be used instead of the oxide 42 and/or the silicon nitride 18. Similarly, to the extent feasible, components for enhancing the reflectivity of the disassociating light can be incorporated into (or onto exposed via 39 surfaces of) the polysilicon layer 16 and/or the semiconductor substrate 10.

The pre-code hole pattern also facilitates exposure and removal of photoresist without the need for optical proximity correction, which can be required in conventional photolithography methods due to the increasing density of the structures of the integrated circuit and the smaller spaces between the structures. Thus, flood exposure of light onto the semiconductor substrate having exposed voids 39 can remove the resist inside those voids when the critical dimension is small, and therefore, the pre-code hole pattern, or the voids 39, of the present invention can operate to solve potential problems associated with iso/dense critical dimension bias.

Figure 6:
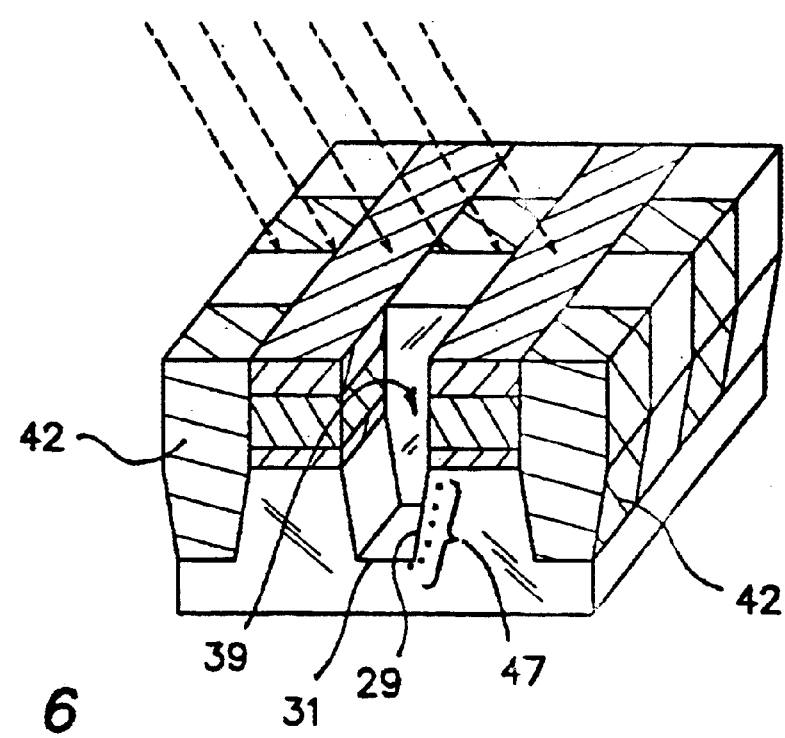
FIG. 6 is a perspective view similar to FIG. 5 with a further portion of the photoresist layer removed, and showing the direction of ion implantation.

As shown in FIG. 6, the void 39 that has had photoresist 42 removed therefrom may now be exposed to a dopant impurity, such as an N-type impurity which may comprise arsenic or phosphorous. As understood by persons skilled in the art, other impurities may be implanted, such as P-type impurities, including boron. The implantation process is illustrated by the arrows in FIG. 6, wherein dopant 47 is implanted into the second sidewall 29 along a length of the sidewall 29 extending from the trench base 31 to the gate oxide layer 14. The implantation process may occur with an implantation energy ranging from, for example, 10 to 100 KeV, and at a dose of arsenic ions ranging from $0.5 \times 10^{14}$ dopants/cm$^2$ to $1.0 \times 10^{16}$ dopants/cm$^2$.

In the illustrated embodiment, the implantation occurs at an angle from a vertical line extending through the device. The angle of implantation may range from about 1° to about 45° from vertical and, more preferably, may range from about 5° to about 20° from vertical. In the illustrated embodiment, the angle of implantation is about 15° from vertical. The angular implantation facilitates implantation of the dopant 47 into the second sidewall 29 of the trench 24. In particular, with the formation of the pre-code hole pattern as described above, the critical dimension of the trench sidewall may be more easily controlled over conventional methods, since conventional methods can rely on a maximum critical dimension in the center of the trench, not on the side wall. Such prior art methods encounter greater difficulties in connection with implant window controlling, since the critical dimension for this layer is on sidewall area. Thus, by way of the present invention, the critical dimension can be off-centered so that its maximum is closer to the trench sidewall, and preferably centered near to or on the trench sidewall.

In order to facilitate the implantation of dopant into the void 39, it is desirable in accordance with an aspect of the present invention to reduce the effective height from the trench base 31 to the top of the polybar 20. Thus, in the illustrated embodiment portions of the photoresist 42 remaining on the silicon nitride layers 18 of the polybars 20 are etched back, to thereby increase the trench exposure areas (and thus hole resolution) to the implanted dopant 47. This etching may be accomplished by substantially uniformly thinning down the photoresist (using, for example, an etch back and/or flood exposure) to a height of the silicon nitride layer 18. In addition, it may be desirable to reduce the thickness of the silicon nitride layers 18 to enhance the angular ion implantation. However, the silicon nitride should not be reduced so much as to lose its insulative properties between the polysilicon layer 16 and a conductive layer that will be disposed over the silicon nitride layer 18 in later manufacturing steps. In other embodiments, the photoresist 42 is etched back, as discussed above, prior to use of the photoresist mask comprising the first ROM code pattern.

After implanting the desired dopant ions into the select voids in accordance with the pattern of the first ROM code, additional photoresist 42' (FIG. 7) can be deposited over the substrate to fill the voids which have just been implanted and which are not to be implanted again. The photoresist 42 may also first be removed using an ash procedure before deposition of the second photoresist 42' onto the wafer to yield a structure similar to that of FIG. 4. A second photoresist mask having a pattern for a second ROM code can then be positioned over the photoresist 42' to permit the removal of photoresist from select voids 39' based on the second ROM code pattern. In certain embodiments, the photoresist 42' is etched back to a level of the silicon nitride layer before use of the second photoresist mask, as discussed above. Photoresist 42' is then removed from the voids 39' that are exposed by the second photoresist mask.

Figure 7:
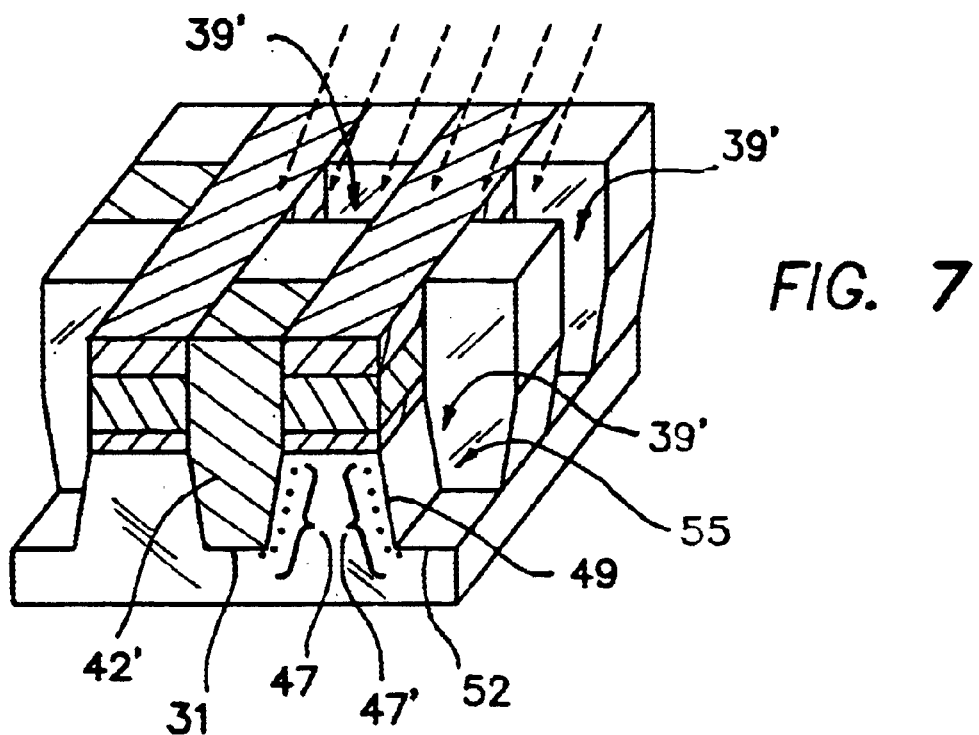
FIG. 7 is a perspective view similar to FIG. 6 with different select voids free of photoresist, and showing another direction of ion implantation.

FIG. 7 illustrates the device of FIG. 6 having voids 39' with photoresist removed therefrom. As understood in the art, the particular voids 39' that have had photoresist removed will be based on the particular ROM code pattern of the second photoresist mask. Dopant 47' implantation may then proceed, and as illustrated, the dopant 47' is implanted at an angle from vertical that is generally equal to the angle of the first implantation, but in the opposite direction from an orthogonal axis. The angle of implantation may thus range from about 1° to about 45° from vertical and, more preferably, from about 5° to about 20° from vertical, with the illustrated angle of implantation being about 15° from vertical. In specific reference to the figures, the first implantation was angled to the left so that the dopant ions were implanted on the second sidewall 29 of trench 24. The second implantation is angled to the right so that the dopant ions 47' are implanted into a sidewall 49 of a trench 55 along a length of the sidewall 49 extending from the trench base to the gate oxide layer 14. In modified embodiments, the dopants 47 and/or 47' may extend along smaller or greater lengths. In a preferred embodiment each sidewall implant extends into a portion of the corresponding trench base such that it will overlap a subsequently-implanted bit line. The implantation process may occur with an implantation energy ranging from, for example, 10 to 100 KeV, and at a dose of arsenic ions ranging from $0.5 \times 10^{14}$ dopants/cm$^2$ to $1.0 \times 10^{16}$ dopants/cm$^2$.

The first and second ROM code implants represent the programming of first and second bits, respectively, thereby creating a plurality of dual bit transistors. The dual bit transistors are programmed such that each cell is either implanted or not implanted on both the left sidewall and the right sidewall beneath the gate.

Figure 8:
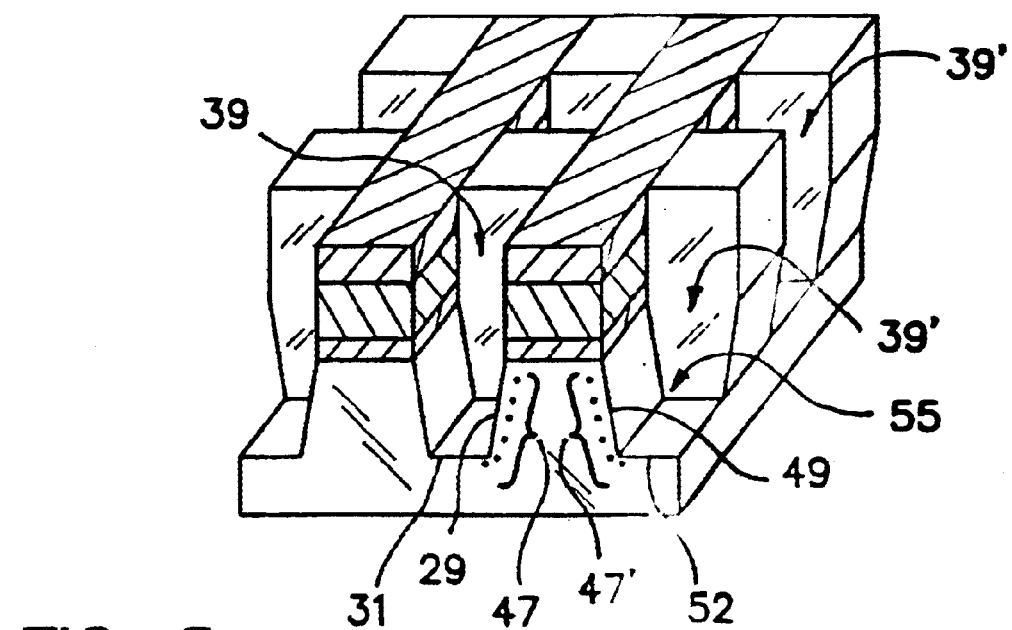
FIG. 8 is a perspective view similar to FIG. 7 after ion implantation and after removal of the photoresist layer.

After the implantation of the dopant ions, the remaining photoresist 42' may be removed from the device using an ash procedure to yield the structure shown in FIG. 8. Thereafter, the oxide fences are removed by a selective wet etch or a dry etch, and the trench bases are implanted with a dopant such as arsenic to form bit lines extending along the lengths of the trenches. In an alternative embodiment, the bit lines may be implanted after formation of the trenches, but before the introduction of the oxide fences.

Once the bit lines, and both bit line junctions (formed by first and second ROM code implants) for each dual bit transistor are created, if the thin poly and oxide layers lying above the silicon nitride layer have not yet been removed, an additional etch step is then performed to remove them. Once the silicon nitride layer is clear, a doped poly is deposited such that it fills and extends above the trenches and channels. The doped silicon is then etched back such that it extends about 400 to 1000 A above the trenches, but still within the channels. An oxide is then grown over the doped poly or deposited and etched back so that a thickness between 100 and 300 A remains. The silicon nitride layer is then removed using a dry or wet etch. One or more doped or undoped silicon layers may then be applied and etched back to form word lines that extend orthogonal to the bit lines, using standard photolithographic techniques for patterning. The device may then proceed to the next station in manufacturing.

Thus, the formation of oxide fences between polybars thereby forming a pre-code hole pattern, such as a square-shaped pattern, advantageously facilitates the implantation of dopant impurities, especially in integrated circuits having densely packed components. The pre-code hole pattern, utilizing an oxide fence, provides a greater control over the critical dimension, especially of the trench sidewall critical dimension, and provides a larger process window, thereby providing a finer resolution and control of dopant implantation. In addition, although the inventive methods can be seen to add a non-critical photoresist application and etching step, compared to conventional processes, the inventive methods can nonetheless change the masking and dopant deposition process from critical to non-critical. The present invention thus departs from conventional methods where the steps in controlling photoresist coverage may be critical in the fabrication of read only memory devices.

In view of the foregoing, it will be understood by those skilled in the art that the methods of the present invention can facilitate formation of read only memory devices, and in particular read only memory devices exhibiting dual bit cell structures, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method for making an integrated circuit on a semiconductor substrate, the method comprising the steps of:
   (a) providing a semiconductor substrate having a plurality of polybars disposed on a gate oxide layer, each of the polybars oriented parallel to the other polybars and disposed on either side of at least one trench defined by a sidewall which is formed in the semiconductor substrate thereby creating a channel between the polybars;
   (b) forming a plurality of reflective dielectric fences between the plurality of polybars to create a plurality of voids bounded by the plurality of polybars and the reflective dielectric fences;
   (c) implanting a dopant into at least one of the voids;
   (d) removing the reflective dielectric fences; and
   (e) implanting a dopant into a base of the trench.

2. The method of claim 1, wherein:
   the at least one trench comprises a plurality of trenches; and
   the material used to form the plurality of reflective dielectric fences is an oxide.

3. The method of claim 1, further comprising, before step (b), the steps of:
   (I) adding one or more thin oxide layers to the existing structures; and
   (II) adding a thin polysilicon layer over the thin oxide layers.

4. The method of claim 3, comprising a step of removing photoresist from select voids using a first photoresist mask having a pattern for a first ROM code.

5. The method of claim 1, further comprising a step of filling the voids with photoresist before step (c).

6. The method of claim 5, comprising a step of filling the select voids with a second photoresist layer and then removing photoresist from select voids using a second photoresist mask having a pattern for a second ROM code.

7. The method of claim 1, wherein the dopant is implanted into at least one sidewall of the trench of the semiconductor substrate.

8. The method of claim 1, wherein the dopant is implanted at approximately 15 degrees from normal.

9. The method of claim 1, wherein the dopant comprises an N-type impurity.

10. The method of claim 1, wherein step (e) takes place prior to step (b) and after step (a).

11. A method for making an integrated circuit on a semiconductor substrate, the method comprising the steps of:
    (a) providing a semiconductor substrate having a plurality of polybars disposed on a gate oxide layer, each of the polybars oriented parallel to the other polybars and disposed on either side of at least one trench formed in the semiconductor substrate thereby creating a channel between the polybars;
    (b) forming a reflective dielectric fence between the plurality of polybars to create a plurality of voids bounded by the plurality of polybars and the reflective dielectric fence;
    (c) filling the voids with photoresist and removing the photoresist from select voids using a first photoresist mask having a pattern for a first ROM code;
    (d) implanting a dopant into the voids having the photoresist removed in step (c);
    (e) filling the voids implanted in step (d) with photoresist and removing the photoresist from select voids using a second photoresist mask having a pattern for a second ROM code; and
    (f) implanting a dopant into the voids having the photoresist removed in step (e).

12. The method of claim 11, further comprising, before step (b), the steps of:
    (I) adding one or more thin oxide layers to the existing structures; and
    (II) adding a thin polysilicon layer over the thin oxide layers.

13. The method of claim 11, wherein the channel between the polybars has a length and the reflective dielectric fence is orthogonally disposed to the length of the channel.

14. The method of claim 11, wherein the at least one trench comprises a plurality of trenches and the material used to form the reflective dielectric fence is an oxide.

15. The method of claim 11, wherein no antireflective coating is applied before the photoresist.

16. The method of claim 11, wherein the dopant is an N-type impurity.

17. The method of claim 11, wherein the dopant is implanted into at least one sidewall of the trench.

18. The method of claim 11, wherein the dopant is implanted at approximately 15 degrees from normal.

19. A method for making an integrated circuit on a semiconductor substrate, the method comprising the following steps:
    (a) forming a plurality of polybars on the semiconductor substrate, each polybar having a length and comprising a gate oxide layer, a polybar conductive layer, and a polybar dielectric layer, and each polybar being disposed parallel to each of the other polybars on the semiconductor substrate;
    (b) forming at least one trench in the semiconductor substrate between the plurality of polybars, thereby creating a channel between the polybars;

(c) filling the trench and the channel with a reflective dielectric layer;

(d) removing portions of the reflective dielectric layer in the trench to form a pattern perpendicular to the length of the polybars, and to form a plurality of voids on the semiconductor substrate with each void being bounded by the polybars and portions of the reflective dielectric layer not removed;

(e) filling the voids with a first photoresist;

(f) selectively removing the first photoresist from certain voids;

(g) implanting a dopant into the voids without photoresist;

(h) filling the voids without the first photoresist with a second photoresist;

(i) selectively removing photoresist from certain voids;

(j) implanting the dopant into the voids without photoresist;

(k) removing the remaining photoresist from the semiconductor substrate;

(l) removing the remaining reflective dielectric layer from the trench; and (m) implanting a dopant into a base of the trench.

20. The method of claim 19, wherein the at least one trench comprises a plurality of trenches and the material used to form the reflective dielectric layer is an oxide.

21. The method of claim 19, further comprising, before step (c), the steps of:

(I) adding one or more thin oxide layers to the existing structures; and (II) adding a thin polysilicon layer over the thin oxide layers.

22. The method of claim 19, wherein step (m) occurs before step (b) and after step (a).

* * * * *